(12) United States Patent
Sakaguchi et al.

(10) Patent No.: US 7,597,233 B2
(45) Date of Patent: Oct. 6, 2009

(54) APPARATUS AND METHOD OF MOUNTING CONDUCTIVE BALL

(75) Inventors: Hideaki Sakaguchi, Nagano (JP); Kiyoaki Iida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/178,270

(22) Filed: Jul. 23, 2008

(65) Prior Publication Data

US 2009/0026247 A1    Jan. 29, 2009

(30) Foreign Application Priority Data

Jul. 24, 2007    (JP) .............. 2007-192018

(51) Int. Cl.
*B23K 1/00* (2006.01)
*B23K 35/14* (2006.01)
*B23K 31/00* (2006.01)
*B23K 35/12* (2006.01)

(52) U.S. Cl. .............. 228/41; 228/56.3; 228/180.22; 228/245; 228/246

(58) Field of Classification Search .............. 228/33, 228/41, 56.3, 180.22, 245, 246, 248.1; 438/612, 438/613
See application file for complete search history.

(56) References Cited

U.S. PATENT DOCUMENTS

| | | | | |
|---|---|---|---|---|
| 5,785,237 A | * | 7/1998 | Lasto et al. | 228/180.22 |
| 5,839,641 A | * | 11/1998 | Teng | 228/41 |
| 6,059,176 A | * | 5/2000 | Azdasht et al. | 228/254 |
| 6,109,509 A | * | 8/2000 | Sakai et al. | 228/246 |
| 6,158,649 A | * | 12/2000 | Miura | 228/246 |
| 6,182,356 B1 | * | 2/2001 | Bolde | 29/821 |
| 6,202,918 B1 | * | 3/2001 | Hertz | 228/246 |
| 6,284,568 B1 | * | 9/2001 | Yamamoto | 438/108 |
| 6,347,734 B1 | * | 2/2002 | Downes | 228/180.21 |
| 6,412,685 B2 | * | 7/2002 | Hertz et al. | 228/246 |
| 6,427,903 B1 | * | 8/2002 | Foulke et al. | 228/246 |
| 6,460,755 B1 | * | 10/2002 | Inoue et al. | 228/246 |

(Continued)

FOREIGN PATENT DOCUMENTS

| JP | 2002-151539 | 5/2002 |
|---|---|---|
| JP | 2006-318994 | 11/2006 |

*Primary Examiner*—Jessica L Ward
*Assistant Examiner*—Carlos Gamino
(74) *Attorney, Agent, or Firm*—Rankin, Hill & Clark LLP

(57) ABSTRACT

There is provided a conductive ball mounting apparatus for mounting one conductive ball on each of a plurality of connection pads formed on a substrate. The conductive ball mounting apparatus includes: an outer frame; an inner cylinder provided in the outer frame, wherein an upper surface and a lower surface of the inner cylinder are opened; a sieve provided in the inner cylinder, wherein the inner cylinder is partitioned into an upper space and a lower space by the sieve; an inlet port for supplying an air from an outside to the lower space of the inner cylinder; a mask provided to a lower end of the outer frame and having openings, the openings being provided to correspond to conductive ball mounting positions; and an exhaust port for exhausting an air from an upper surface of the mask to the outside and being provided to the lower end of the outer frame, wherein the inner cylinder is adapted to vibrate without being restricted by the outer frame.

2 Claims, 11 Drawing Sheets

U.S. PATENT DOCUMENTS

| | | | |
|---|---|---|---|
| 6,464,125 B2 * | 10/2002 | Cox et al. | 228/33 |
| 6,533,160 B1 * | 3/2003 | Bourrieres et al. | 228/41 |
| 6,541,364 B2 * | 4/2003 | Mukuno et al. | 438/612 |
| 6,600,171 B1 * | 7/2003 | Farnworth et al. | 257/48 |
| 6,604,673 B1 * | 8/2003 | Bourrieres et al. | 228/246 |
| 6,634,545 B2 * | 10/2003 | Razon et al. | 228/246 |
| 6,638,785 B2 * | 10/2003 | Shiozawa et al. | 438/51 |
| 6,957,760 B2 * | 10/2005 | Cobbley et al. | 228/41 |
| 7,240,822 B2 * | 7/2007 | Takeuchi et al. | 228/246 |
| 7,275,676 B2 * | 10/2007 | Cobbley et al. | 228/41 |
| 7,455,209 B2 * | 11/2008 | Bourrieres et al. | 228/41 |
| 7,475,803 B2 * | 1/2009 | Sumita et al. | 228/246 |
| 2005/0045701 A1 * | 3/2005 | Shindo et al. | 228/246 |
| 2008/0301935 A1 * | 12/2008 | Iida et al. | 29/843 |

* cited by examiner

APPARATUS AND METHOD OF MOUNTING CONDUCTIVE BALL

This application is based on and claims priority from Japanese Patent Application No. 2007-192018, filed on Jul. 24, 2007, the entire contents of which are incorporated by reference herein.

BACKGROUND

1. Technical Field

The present disclosure relates to an apparatus and method of mounting one conductive ball on each of a plurality of connection pads on a substrate.

2. Related Art

Upon forming the solder bumps on the connection pads for flip-chip bonding formed on a substrate such as a wafer or a circuit substrate, in the related art, a solder paste is coated by the screen printing and then fused by reflow soldering. In this case, with higher packaging density of a semiconductor device, a fine pitch such as 200 μm or strictly 150 μm is demanded as a bump pitch. When the solder paste is coated by the screen printing at such a fine pitch, a bridge between the bumps or adhesion of the solder paste to a printing mask occurs. Therefore, it is difficult to form the solder bumps at a fine pitch by the screen printing.

For this reason, as a method of forming the bumps at a fine pitch, it is considered that the solder balls are arranged on the connection pads.

As one method, there has been known a method of chucking solder balls with a chucking jig to carry the solder balls and then mounting the solder balls on connection pads. The method is applied to board mounting connection pads on an external connection terminal side of Ball Grid Array (BGA). The adhesive soldering flux is coated on the connection pads in advance, and then the solder balls are adhered/secured onto the connection pads respectively. Then, the bumps are formed by reflowing the solder balls. In this case, a diameter of the solder ball is as large as about 0.3 to 0.7 mm. In contrast a diameter of the solder ball used at a fine pitch must be reduced to 100 μm or less. When a size of the solder ball becomes smaller in this manner, such a problem is caused that the solder balls are clumped by an action of the static charges or the solder ball cannot be chucked exactly into a chucking port of the chucking jig due to the influence of an airflow. Also, the chucking port of the chucking jig needs to be miniaturized in size and also a manufacturing cost is increased. As a result, this method is not practical in use.

Therefore, as another method, there has been known a method of feeding solder balls into each opening of a mask placed on a substrate (so-called a "feeding method" hereinafter). That is, the flux is coated on the connection pads of the substrate, then the metal mask is aligned with the pads and then is overlapped thereon. The solder balls are fed from the upper side of the metal mask, and then the solder ball is dropped into openings of the metal mask respectively. The solder balls are dropped down from a container having an opening such as a slit on a bottom surface thereof. The opening is designed such that the solder balls are dropped onto the mask with a proper amount. One solder ball is fed into each opening of the mask and is mounted on the connection pad that is aligned with the opening, and then is adhered/secured to the connection pad by the adhesive flux coated on the connection pads. The solder balls remaining on the mask are recovered by the recovering mechanism.

According to this method, the mask is not brought into contact with the ball feeding head (container), and an air gap is formed to be the ball diameter or less. For example, JP-A-2002-151539 discloses that balls are not overlapped with each other and are aligned on one layer by controlling an air gap. Also, JP-A-2006-318994 discloses that the gap is controlled to be smaller than the ball diameter such that the balls are not left on the mask.

However, in the method of maintaining the gap between the mask and the head, the balls might be pinched between the mask and the head, and then be deformed. In particular, in the case of the circuit substrate (resin substrate), warpage becomes large and also an unevenness in thickness of the substrate becomes large. As a result, when a size of the substrate is large, it is very difficult to uniformly maintain the gap between the mask and the head over the whole substrate, and thus it is impossible to avoid such an event that the balls are pinched between the mask and head.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

It is an aspect of the present invention to provide an apparatus and method of mounting conductive balls such as solder balls, capable of mounting a minute solder ball on each of connection pads formed on a substrate. According to the apparatus and method of the present invention, the solder balls are not pinched between a mask and a head, which is inevitable in the feeding method in the related art.

According to one or more aspects of the present invention, in a conductive ball mounting apparatus for mounting one conductive ball on each of a plurality of connection pads formed on a substrate, the conductive ball mounting apparatus includes:

an outer frame;

an inner cylinder provided in the outer frame, wherein an upper surface and a lower surface of the inner cylinder are opened;

a sieve provided in the inner cylinder, wherein the inner cylinder is partitioned into an upper space and a lower space by the sieve;

an inlet port for supplying an air from an outside to the lower space of the inner cylinder;

a mask provided to a lower end of the outer frame and having openings, the openings being provided to correspond to conductive ball mounting positions; and an exhaust port for exhausting an air from an upper surface of the mask to the outside and being provided to the lower end of the outer frame, wherein the inner cylinder is adapted to vibrate without being restricted by the outer frame.

According to one or more aspects of the present invention, in a method of mounting one conductive ball on each of a plurality of connection pads formed on a substrate using the conductive ball mounting apparatus, the method includes:

(a) preparing the substrate having the plurality of connection pads coated with an adhesive flux;

(b) storing the conductive balls into the upper space of the inner cylinder via the upper surface of the inner cylinder;

(c) holding the conductive ball mounting apparatus over a conductive ball mounting target area of the substrate;

(d) moving down the conductive ball mounting apparatus;

(e) aligning openings of the mask with the connection pads;

(f) stopping the conductive ball mounting apparatus in such a state that a gap between the mask and an upper surface of the substrate is below a diameter of the conductive ball;

(g) dropping the conductive balls from the upper space of the inner cylinder onto the mask through the sieve by vibrating the inner cylinder, thereby mounting the conductive balls on the connection pads through the openings of the mask;

(h) generating an airflow directed to the outside on the mask by exhausting an air via the exhaust port and by supplying an air via the inlet port, thereby exhausting the conductive balls remaining on the mask to the outside;

(i) moving up the conductive ball mounting apparatus;

(j) moving the conductive ball mounting apparatus to another conductive ball mounting target area of the substrate.

According to one or more aspects of the present invention, in a conductive ball mounting apparatus for mounting one conductive ball on each of a plurality of connection pads formed on a substrate, the conductive ball mounting apparatus includes:

an outer frame;

an inner cylinder provided in the outer frame, wherein an upper surface and a lower surface of the inner cylinder are opened;

a sieve provided in the inner cylinder, wherein the inner cylinder is partitioned into an upper space and a lower space by the sieve;

an inlet port for supplying an air from an outside to a clearance between the inner cylinder and the outer frame and being provided to pass through the outer frame;

an exhaust port for exhausting an air from the clearance between the inner cylinder and the outer frame to the outside and being provided to pass through the outer frame; and a mask provided to a lower end of the outer frame and having openings, the openings being provided to correspond to conductive ball mounting positions, wherein the inner cylinder is adapted to vibrate without being restricted by the outer frame.

According to one or more aspects of the present invention, in a method of mounting one conductive ball on each of a plurality of connection pads formed on a substrate using the conductive ball mounting apparatus, the method includes:

(a) preparing the substrate having the plurality of connection pads coated with an adhesive flux;

(b) storing the conductive balls into the upper space of the inner cylinder via the upper surface of the inner cylinder;

(c) holding the conductive ball mounting apparatus over a conductive ball mounting target area of the substrate;

(d) moving down the conductive ball mounting apparatus;

(e) aligning openings of the mask with the connection pads;

(f) stopping the conductive ball mounting apparatus in such a state that a gap between the mask and an upper surface of the substrate is below a diameter of the conductive ball;

(g) dropping the conductive balls from the upper space of the inner cylinder onto the mask through the sieve by vibrating the inner cylinder, thereby mounting the conductive balls on the connection pads through the openings of the mask;

(h) generating an airflow directed to the outside on the mask by exhausting an air via the exhaust port and by supplying an air via the inlet port, thereby exhausting the conductive balls remaining on the mask to the outside or thereby maintaining the conductive balls remaining on the mask in the clearance in front of the exhaust port;

(i) moving up the conductive ball mounting apparatus;

(j) moving the conductive ball mounting apparatus to another conductive ball mounting target area of the substrate.

According to the present invention, the solder balls are not pinched between the mask and the head, which is inevitable in the feeding method in the related art. Also, since the solder balls can be mounted in every solder ball mounting target area of the substrate by moving the head, it is not necessary to properly maintain a clearance between the head and the substrate surface over the whole substrate. A proper clearance should be maintained individually only in the solder ball mounting target area. As a result, the solder balls can be suppressed to be pinched between the head and the substrate surface.

I is advantageous that the mask is made of the conductive material. Thus, the static charges of the conductive balls can be dissipated to the outside via the mask. As a result, aggregation of the minute balls caused due to the static charges never occurs.

Other aspects and advantages of the present invention will be apparent from the following description, the drawings, and the claims.

BRIEF DESCRIPTION OF THE DRAWINGS

The above and other aspects, features and advantages of the present invention will be more apparent from the following more particular description thereof presented in conjunction with the following drawings wherein.

DETAILED DESCRIPTION OF THE EXEMPLARY EMBODIMENTS OF THE PRESENT INVENTION

Exemplary embodiments of the present invention will be described with reference to the drawings hereinafter.

Embodiment 1

Figure 1:
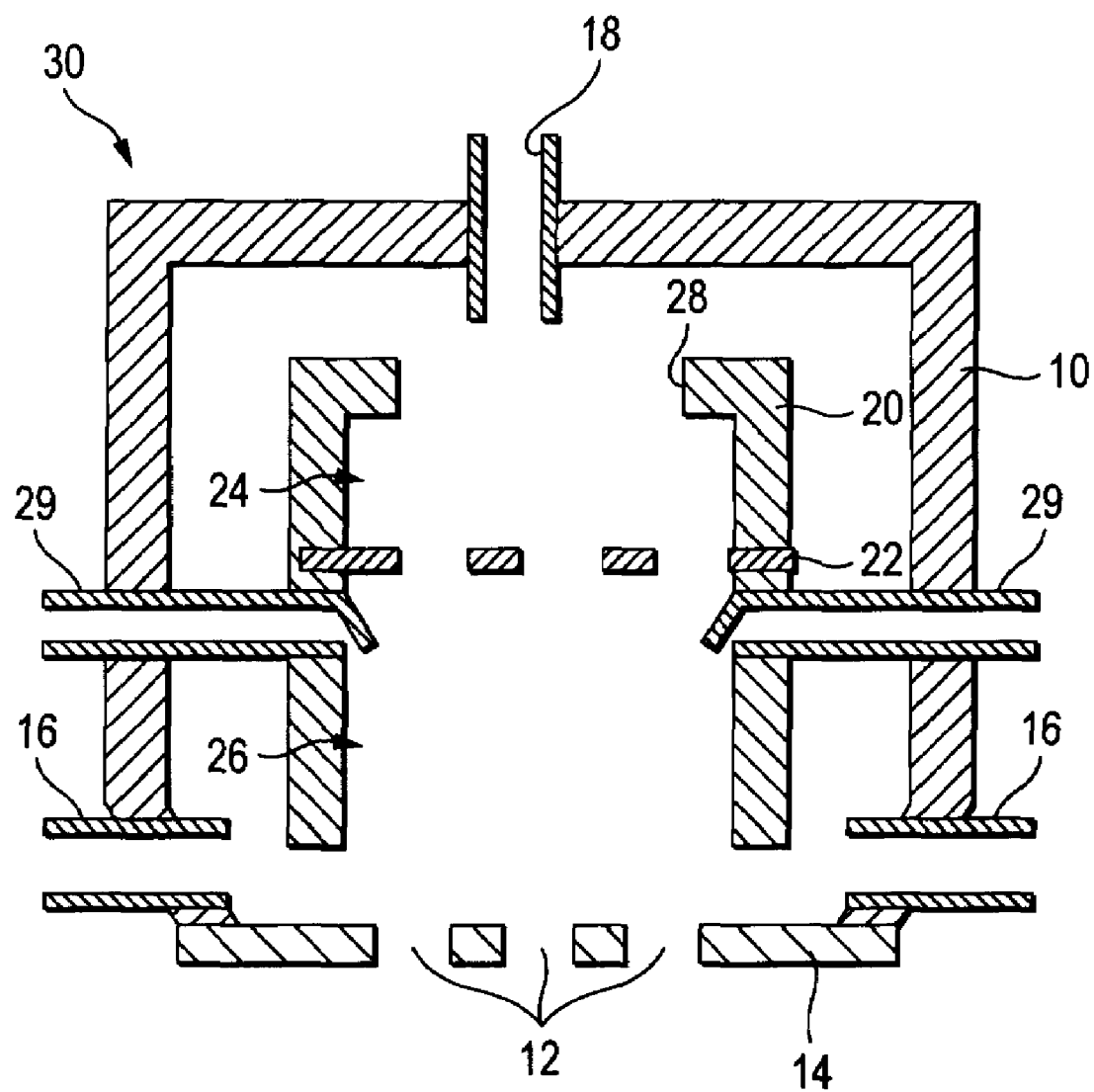
FIG. 1 is a sectional view showing a main portion of a head of a solder ball mounting apparatus according to Embodiment 1 of the present invention.

According to exemplary embodiments of the present invention, in addition to a solder ball, a metallic ball such as a copper ball, a nickel ball; a ball in which a solder layer is formed on a surface of a core of the metallic ball such as the copper ball, the nickel ball; a ball in which the solder layer is formed on a surface of a core of a resin ball; and a ball in which the metallic layer made of copper or nickel is formed on the surface of the core of the resin can be used as a conductive ball according to exemplary embodiments of the present invention. FIG. 1 shows a head of a solder ball mounting apparatus according to Embodiment 1.

The solder ball mounting apparatus includes a head 30 including an outer frame 10 and an inner cylinder 20 provided therein.

To the lower end of the outer frame 10, there are provided a mask 14 having openings 12 corresponding to solder ball mounting positions and exhaust ports 16 for exhausting an air from an upper surface of the mask 14 to the outside. It is advantageous that the mask 14 is made of metal such as nickel or silicon. Also, it is advantageous that the mask 14 is made of conductive material.

The inner cylinder 20 is arranged over the mask 14 in the outer frame 10, and the inner space is divided into an upper space 24 and a lower space 26 by a sieve 22. A shape of the inner cylinder 20 is not particularly limited. For example, A sectional shape of the inner cylinder 20 may be a circular shape, an elliptic shape, or a polygonal shape, and also any shape other than these shapes may be employed.

The upper space 24 constitutes a temporary storage. At the cylinder upper end, a solder ball supply port 28 is provided. The solder balls are fed from an inflow path 18 that passes through an upper end of the outer frame 10, then pass through the solder ball supply port 28 of the inner cylinder 20, and then drop into the upper space, i.e., the temporary storage 24.

A lower end of the lower space 26 is opened. Inlet ports 29 for feeding an air from the outside to a space under the sieve 22 are provided to the lower space 26.

The inner cylinder 20 is substantially independent from the outer frame 10 and can be vibrated by a vibrating device (not shown). The inlet ports 29 provided to the inner cylinder 20 pass through the outer frame 10 and extend to the outside, and are coupled to an air supply apparatus (not shown). In FIG. 1, the inlet ports 29 are illustrated in a fashion that they are joined to the outer frame 10 via through portions. However, in fact, both portions are not joined together, and the inner cylinder 20 can be vibrated freely independently to the outer frame 10. In other words, the outer frame 10 and the inner cylinder 20 are held by a common holding mechanism (not shown), and constitute the head 30 as one unit. This holding mechanism is equipped with a vibration absorbing mechanism in the position where the inner cylinder 20 is held. Thus, this holding mechanism is not vibrated even when the inner cylinder 20 is vibrated, and can hold the outer frame 10 in non-vibrating state.

A method of mounting the solder balls on the connection pads formed on the substrate using the apparatus of Embodiment 1 will be described hereunder.

Firstly, the substrate having the connection pads coated with the adhesive flux is prepared. In the following description, the circuit substrate is used as the substrate, but the silicon wafer may also be used.

Figure 2A:
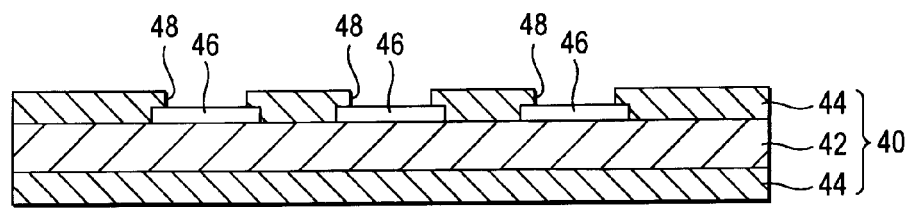
FIGS. 2A to 2D are sectional views showing each step of coating a flux on connection pads of a multilayer circuit substrate on which solder balls are mounted.

As shown in FIG. 2A, a substrate 40 is a multilayer circuit substrate in which a wiring layer and an insulating layer are laminated on both surfaces of a core substrate by the buildup method, or the like. The core substrate is made of resin and has through holes therein. A solder resist layer 44 is formed on upper and lower surfaces of a multilayer circuit portion 42. A plurality of connection pads 46 provided on the upper surface of the multilayer circuit portion 42 are exposed from openings 48 of the solder resist layer 44.

Figure 2B:
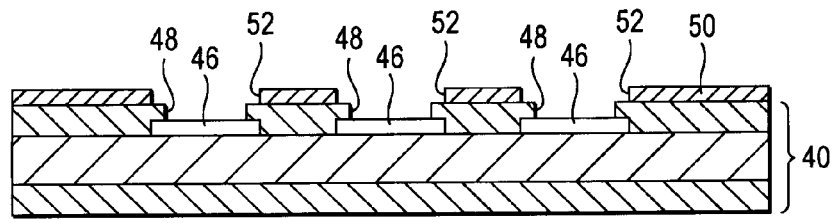
Figure 2C:
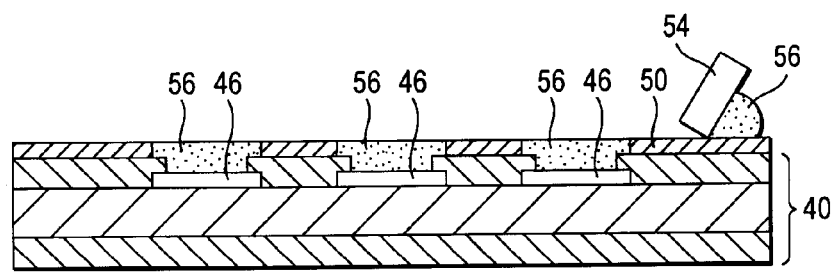
Figure 2D:
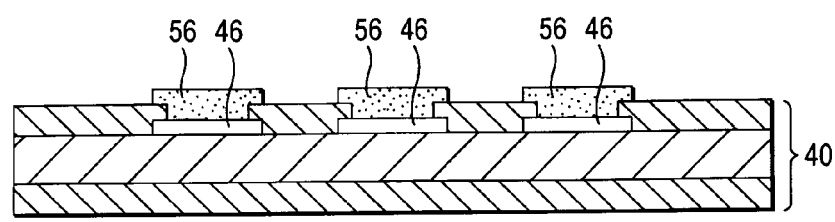
Figure 3:
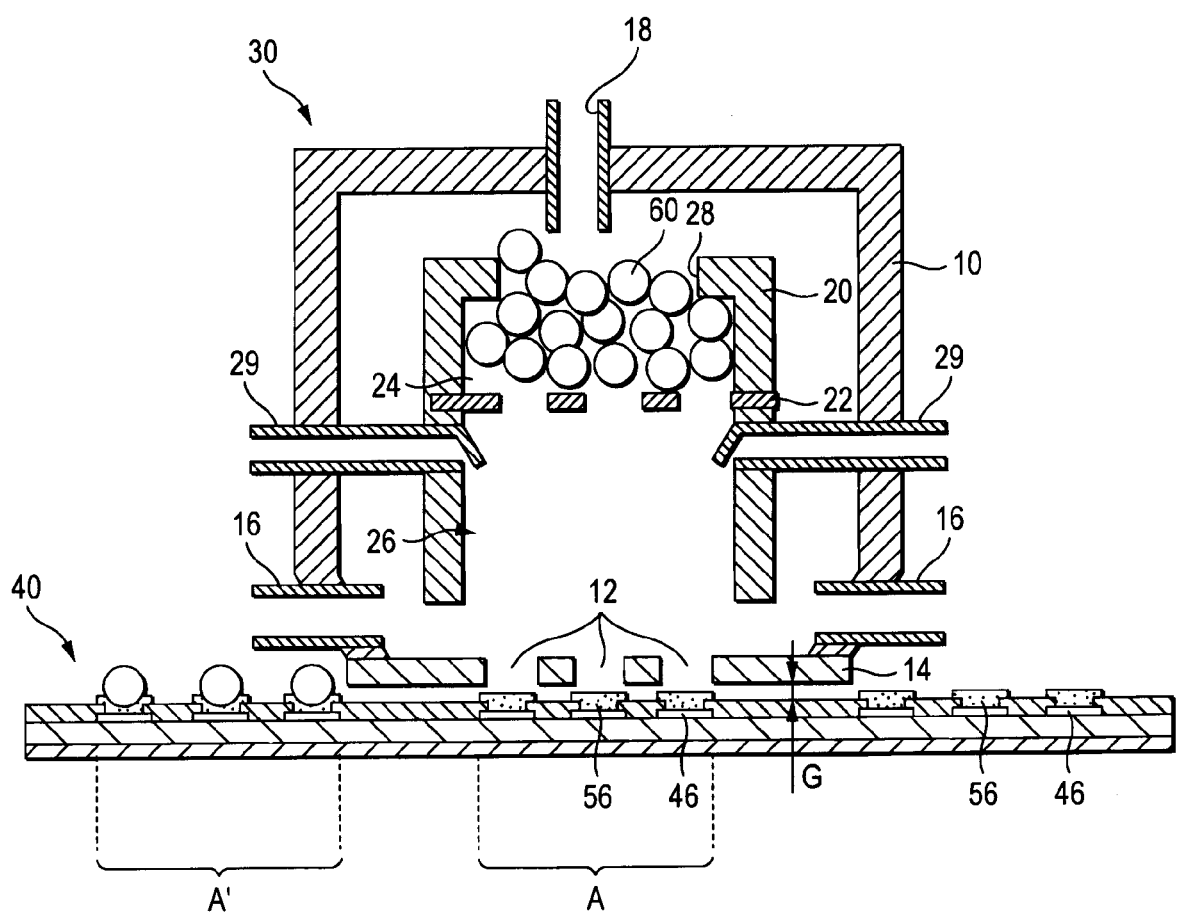
FIG. 3 is a sectional view showing a state that the head of Embodiment 1 is held over the multilayer circuit substrate prepared in FIG. 2.

Actually, a plurality of solder ball mounting target areas A are formed on the substrate 40, as shown in FIG. 3. But only one solder ball mounting target area A is shown in FIG. 2 for convenience of explanation.

For convenience of explanation, the case that the connection pads 46 are provided only on one surface of the substrate 40 will be described hereunder. In the case where the connection pads 46 are provided on both surfaces of the substrate 40, respective steps described hereunder may be applied similarly to both surfaces.

As shown in FIG. 2B, a mask 50 used for flux printing is arranged on the solder resist layer 44. The mask 50 has openings 52 in locations corresponding to the openings 48 of the solder resist layer 44. The mask 50 is arranged such that the openings 52 are aligned with the openings 48 respectively, as shown in FIG. 2B.

As shown in FIG. 2C, a paste-like flux 56 is coated on the mask 50 using a squeegee 54. Thus, a layer of the flux 56 is formed on the connection pads 46 in the openings 52 and 48.

As shown in FIG. 2D, the mask 50 is removed. Thus, the flux 56 is coated on the connection pads 46 in the openings 48 of the solder resist layer 44. The flux 56 has an adhesive property and can adhere and fix the solder balls disposed thereon.

In this example, while the flux is coated by the printing method using the mask 50, such a coating is not limited to this printing. Any methods such as dispenser, transfer or ink jet may be used if such methods are used to coat the flux on the connection pads in the related art.

Then, a method of mounting the solder balls on the connections pads formed on the substrate in which the flux is coated on the connection pads by the conventional method in this manner will be described hereunder.

FIG. 3 shows a state that the head 30 of Embodiment 1 is held over the solder ball mounting target area A of the substrate 40 prepared in FIG. 2. The head 30 is maintained such that the openings 12 of the mask 14 are aligned with the connection pads 46 of the substrate 40.

The head 30 is held over the solder ball mounting target area A such that a gap G between the lower surface of the mask 14 and the upper surface of the substrate 40 is set smaller than a diameter of a solder ball 60. Hence, the solder ball 60 is never pinched between the mask 14 and the connection pad 46.

The solder ball mounting target area A can be set in an adequate size, and then the head 30, particularly the mask 14, can be fabricated correspondingly. Therefore, even though the substrate 40 is large in size and warpage or variation in thickness occurs as a whole, the gap G has only to be maintained only in the small area A. The solder ball mounting target area A is an area in which the solder balls are mounted in a matrix fashion like 10×10, 20×20, 30×30, for example. The head 30 is moved to another solder ball mounting target area A sequentially, then the gap G is adjusted every the area A, and then the solder balls 60 is mounted every area A, and the above steps are repeatedly performed. As a result, the solder balls 60 can be mounted on the whole surface of the large-size substrate 40.

The solder balls 60 are dropped from a solder ball storage tank (not shown) on the outside through the inflow path 18 provided to pass through the outer frame 10, and supplied from the solder ball supply port 28, which is opened at the top end of the inner cylinder 20 of the head 30, into the temporary storage 24. FIG. 3 shows a state that the solder balls 60 have already been mounted in the left-side area A' by the similar operations to those executed in the area A.

Figure 4:
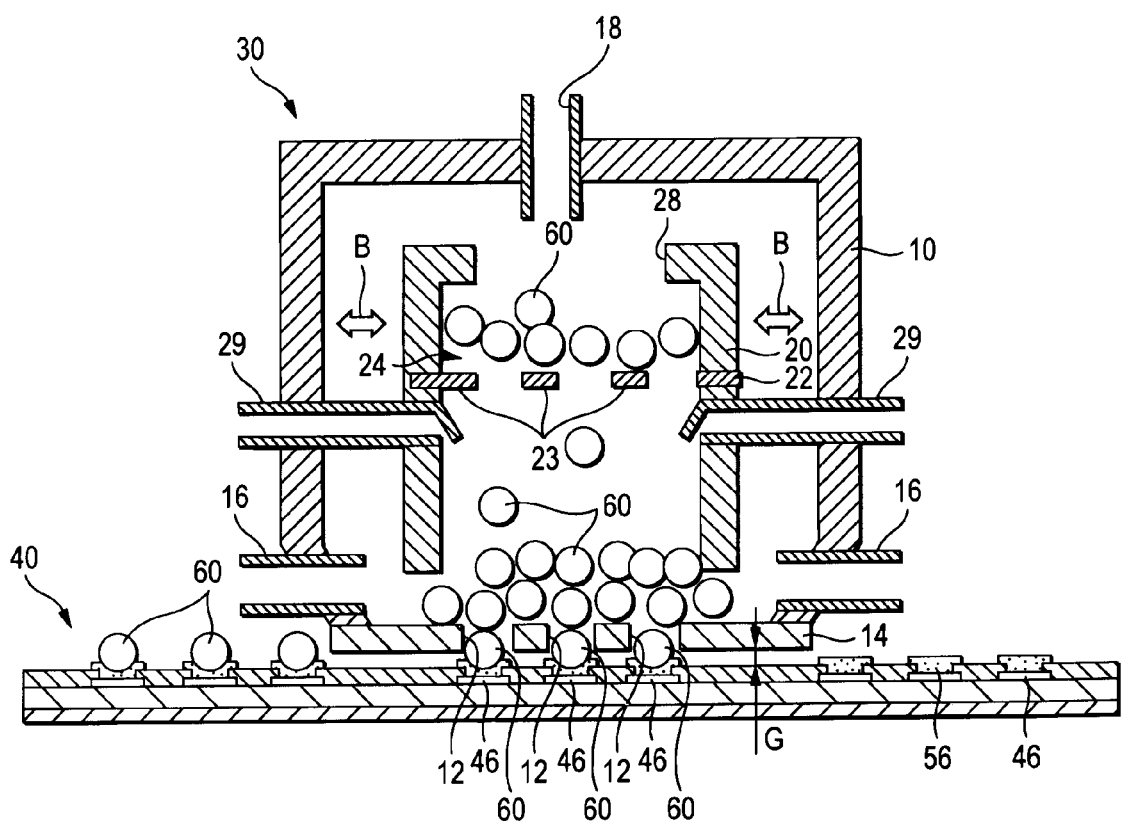
FIG. 4 is a sectional view showing a state that the solder balls are mounted by vibrating an inner cylinder of the head according to Embodiment 1.

Then, as shown in FIG. 4, the solder balls 60 in the temporary storage 24 are dropped onto the mask 14 through meshes 23 of the sieve 22 while the inner cylinder 20 of the head 30 is vibrated horizontally by activating a vibrating mechanism (not shown) as indicated with an arrow B. The solder balls 60 are fed onto the connection pads 46 via the openings 12 of the mask 14 and then mounted thereon. Accordingly, one solder ball 60 is mounted on each of the connection pads 46. The solder balls 60 are adhered/secured onto each of the connection pads 46 by the adhesive flux 56 coated thereon.

Figure 5:
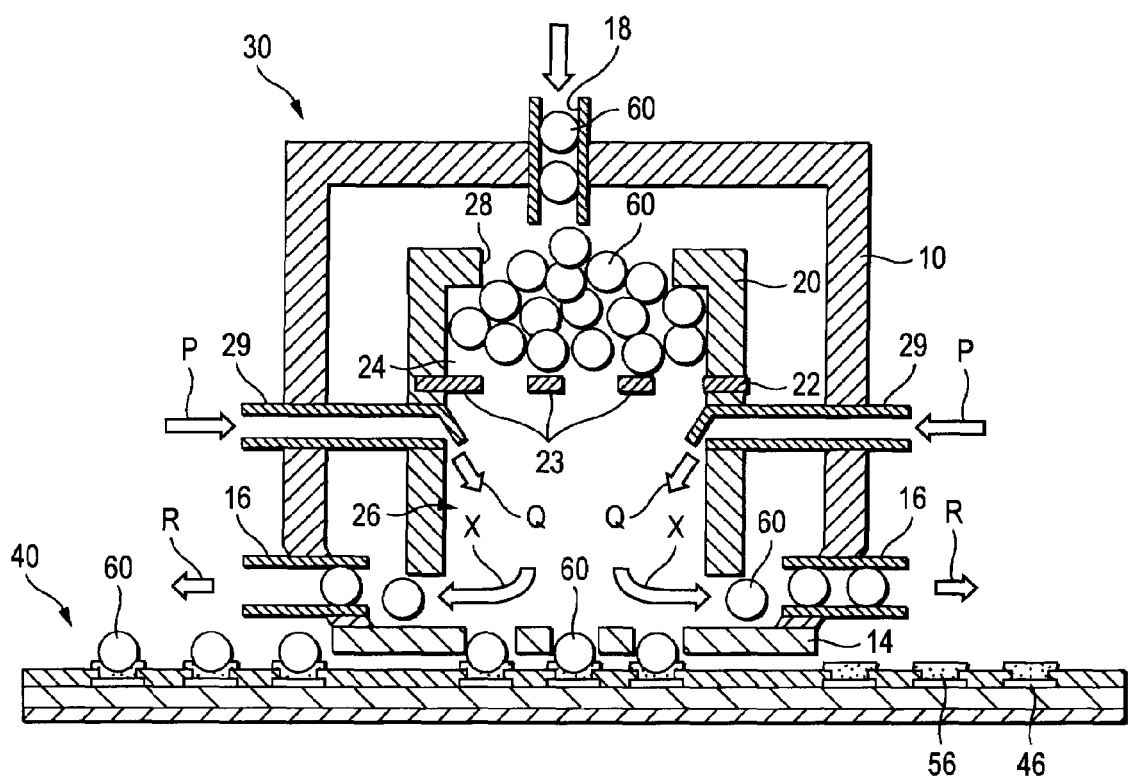
FIG. 5 is a sectional view showing a state that the solder balls remaining on a mask are exhausted after the solder balls are mounted, and then new solder balls are supplied into a temporary storage, according to Embodiments 1.

Then, as shown in FIG. 5, an airflow X being directed outward on the mask 14 is generated by exhausting an air from the exhaust port 16 as indicated with an arrow R, while supplying an air from the inlet port 29 to the lower space 26 using an external air supplying apparatus (not shown) as indicated with arrows P and Q. Thus, the solder balls remaining on the mask 14 are exhausted to the outside.

When the conductive (made of metal such as nickel) mask is used as the mask 14, the static charges of the solder balls 60 can be dissipated via the mask 14. Therefore, even when the solder balls 60 are as minute as 100 μm or less, for example, the aggregation of the solder balls 60 caused due to the static attractive force never occurs.

The solder balls exhausted to the outside are recovered by the recovering mechanism, and can be used again, The new solder balls 60 are dropped and fed into the temporary storage 24 from the inflow path 18 provided to the top end of the outer frame 10 through the solder ball supply port 28. For convenience of illustration, the recovery of the remaining solder balls 60 and the feed of the new solder balls 60 are depicted together in FIG. 5, but the recovery and the feed are not actually carried out at the same time. Actually, the feed of the solder balls 60 is performed in an appropriate timing after the recovery of the remaining solder balls 60 is completed but before mounting of the solder balls is performed in the next solder ball mounting target area by vibrating the inner cylinder 20.

Figure 6:
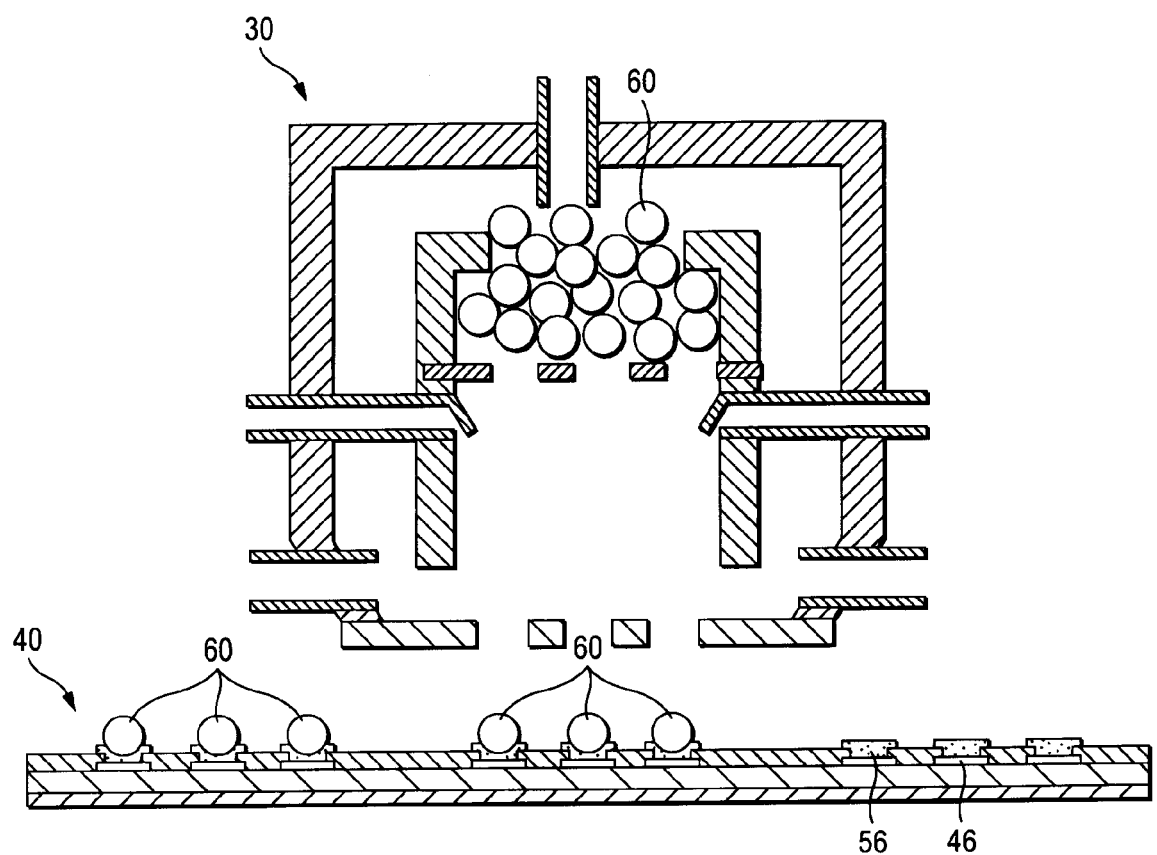
FIG. 6 is a sectional view showing a state that the head is moved up after mounting the solder balls and then exhausting the remaining solder balls.

After the mounting and the recovery of the solder balls 60 are completed, the head 30 is moved up as shown in FIG. 6, then the head is moved to the next solder ball mounting target area on the substrate and stopped there. Then, the steps similar to those applied to the area A are carried out. For convenience of illustration, FIG. 6 shows a state that the solder balls 60 have already been fed into the temporary storage 24. In this case, as described above, the feed of the new solder balls 60 may be performed in an adequate timing until the solder balls 60 are mounted in the next solder ball mounting target area.

When the operations described with reference to FIG. 3 to FIG. 6 are repeatedly performed, one solder ball 60 can be mounted on a large number of connection pads 46 without fail effectively over the whole surface of the large substrate 40.

In this case, the mask 14 attached to the outer frame 10 is fitted exchangeably. The conductive balls can be mounted on all types of substrates only when the mask of the mounting apparatus is exchanged. Therefore, the exchange of the head itself is not needed, and thus manufacturing time and labor, and manufacturing cost can be reduced. For the same reason, the sieve 22 is also fitted exchangeably.

Embodiment 2

Figure 7:
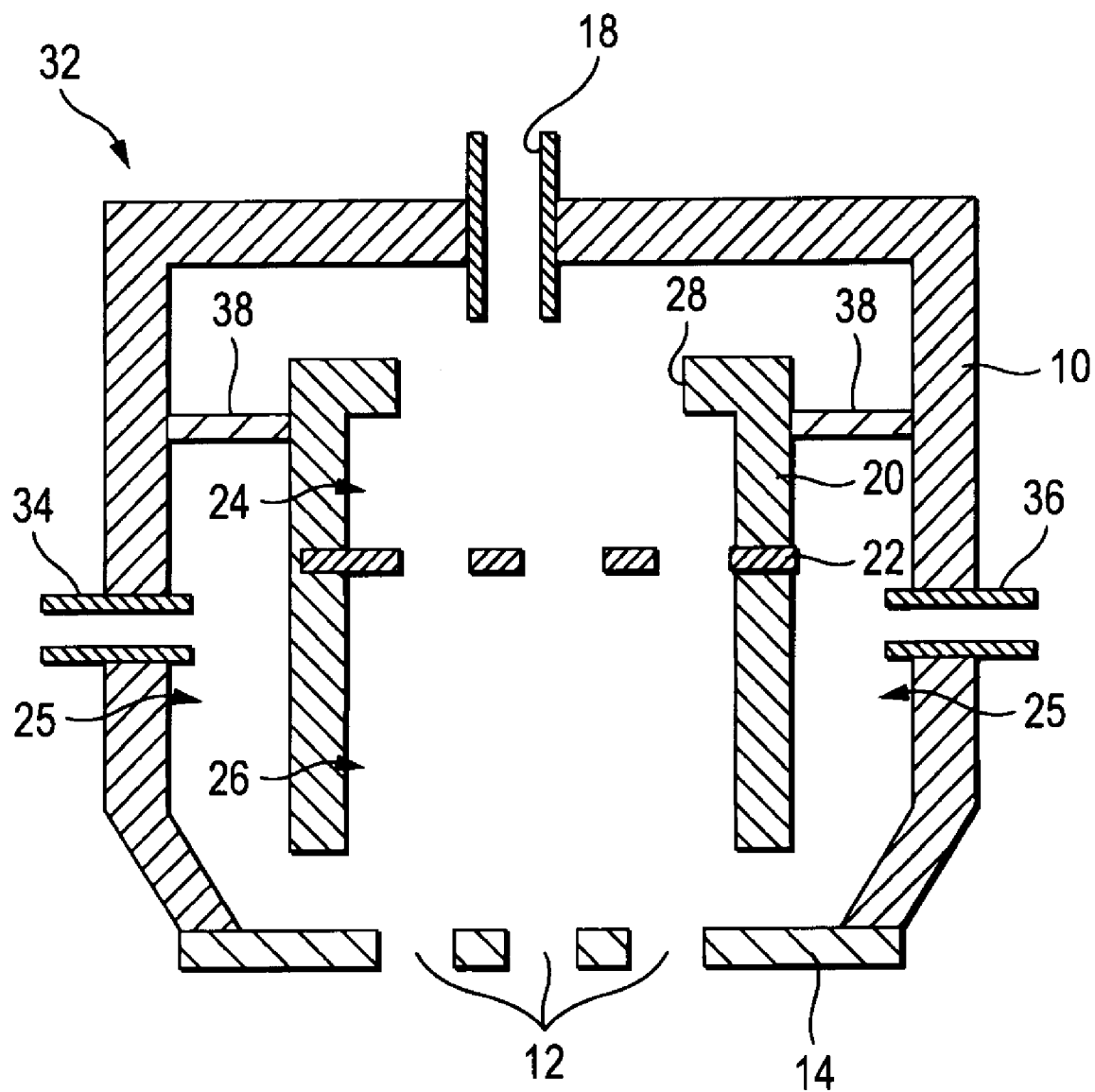
FIG. 7 is a sectional view showing a main portion of a head of a solder ball mounting apparatus according to Embodiment 2 of the present invention.

FIG. 7 shows a head of the solder ball mounting apparatus according to Embodiment 2. The solder ball mounting apparatus of Embodiment 2 includes the outer frame 10 and the inner cylinder 20 provided therein.

The outer frame 10 has: an inlet port 34 for supplying an air into a clearance 25 between the inner cylinder 20 and the outer frame 10; and an exhaust port 36 for exhausting an air from the clearance 25. Also, the outer frame 10 has a mask 14 at the lower end. The mask has the openings 12 in the conductive ball mounting positions. In this example the clearance 25 is partitioned into the upper and lower spaces by a divider plate 38 positioned on the upper side than the inlet port 34 and the exhaust port 36. In this case, the divider plate 38 may be omitted herein.

The mask 14 having the openings 12 in the conductive ball mounting positions is provided to the lower end of the outer frame 10. It is advantageous that the mask 14 is made of metal such as nickel, or made of silicon. Also, it is advantageous that the mask 14 is made of conductive material.

The inner cylinder 20 is held over the mask 14 in the outer frame 10, and an inner space is partitioned into the upper space 24 and the lower space 26 by the sieve 22. A shape of the inner cylinder 20 is not particularly limited. For example, as a sectional shape, a circular shape, an elliptic shape, or a polygonal shape may be employed, and also any shape other than these shapes may be employed.

The upper space 24 constitutes a temporary storage. At the cylinder upper end, a solder ball supply port 28 is provided. The solder balls are fed from an inflow path 18 that passes through an upper end of the outer frame 10, then pass through the solder ball supply port 28 of the inner cylinder 20, and then drop into the upper space, i.e., the temporary storage 24.

A lower end of the lower space 26 is opened.

The inner cylinder 20 is not substantially independent from the outer frame 10 and can be vibrated by a vibrating device (not shown). The inlet port 34 provided to the clearance 25 between the outer frame 10 and the inner cylinder 20 and passes through the outer frame 10 and extends to the outside. The inlet port 34 is coupled to the air supply apparatus (not shown). The outer frame 10 and the inner cylinder 20 are held on the common holding mechanism (not shown), and constitute a head 32 as one unit. This holding mechanism is equipped with a vibration absorbing mechanism in the position where the inner cylinder 20 is held. Thus, this holding mechanism is not vibrated even when the inner cylinder 20 is vibrated, and can hold the outer frame 10 in non-vibrating state.

Next, a method of mounting the solder balls on a large number of connection pads formed on the substrate using the apparatus of Embodiment 2 will be described hereunder.

Figure 8:
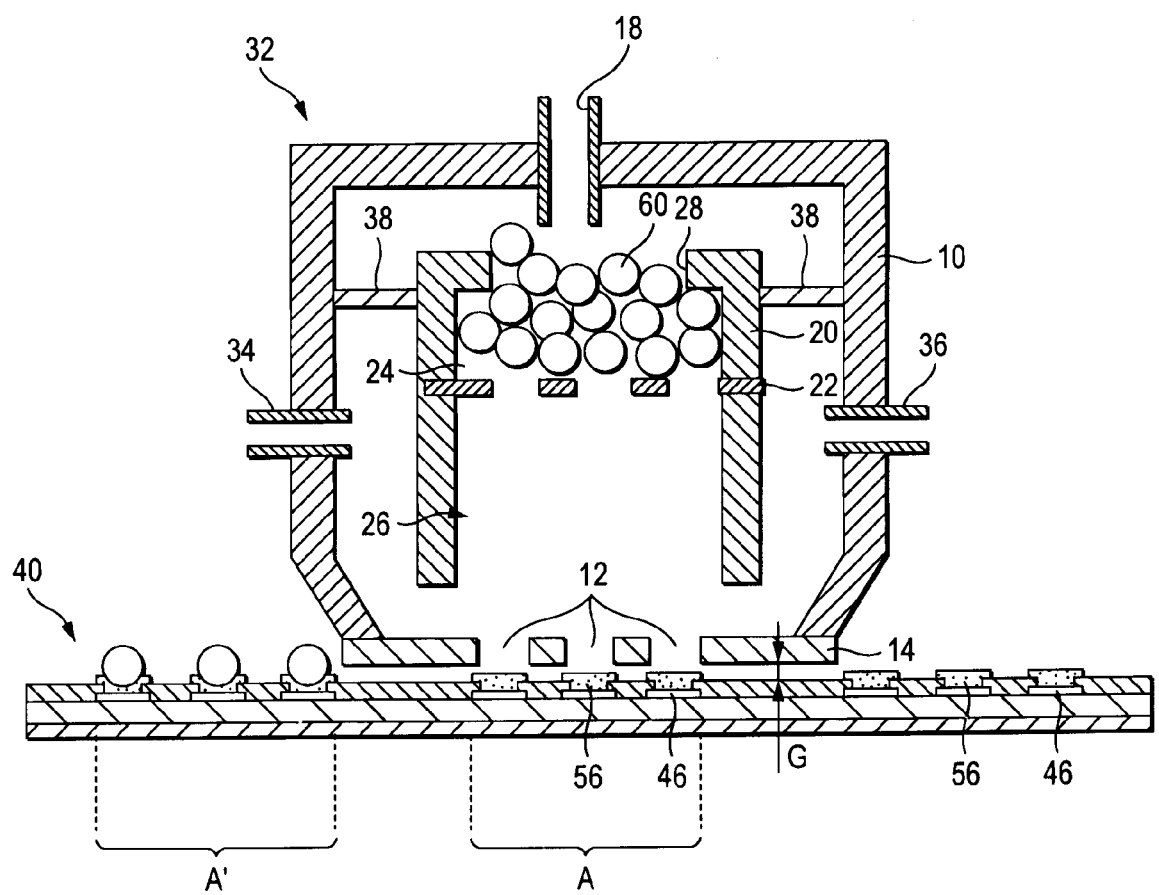
FIG. 8 is a sectional view showing a state that the head of Embodiment 2 is held over the multilayer circuit substrate prepared in FIG. 2.

FIG. 8 shows a state that the head 32 shown in FIG. 7 is held over the solder ball mounting target area A of the substrate 40 prepared in FIG. 2. The head 32 is maintained such that the openings 12 of the mask 14 are aligned with the connection pads 46 of the substrate 40.

The head 32 is held over the solder ball mounting target area A such that a gap G between the lower surface of the mask 14 and the upper surface of the substrate 40 is set smaller than a diameter of the solder ball 60. Hence, the solder ball 60 is never pinched between the mask 14 and the connection pad 46.

The solder ball mounting target area A can be set in an adequate size, and then the head 32, particularly the mask 14, can be fabricated correspondingly. Therefore, even though the substrate 40 is large in size and warpage or variation in thickness occurs as a whole, the gap G has only to be maintained in the small area A. The solder ball mounting target area A is an area in which the solder balls are mounted in a matrix fashion like 10×10, 20×20, 30×30, for example. The head 32 is moved to another solder ball mounting target area A sequentially, then the gap G is adjusted every area A, and then the solder balls 60 is mounted every area A and the above steps are repeatedly performed. As a result, the solder balls 60 can be mounted on the whole surface of the large-size substrate 40.

The solder balls 60 are dropped from a solder ball storage tank (not shown) on the outside through the inflow path 18 provided to pass through the outer frame 10, and supplied from the solder ball supply port 28, which is opened at the top end of the inner cylinder 20 of the head 30, into the temporary storage 24. FIG. 8 shows a state that the solder balls 60 have already been aligned in the left-side area A' by the similar operations to those executed in the area A.

Figure 9:
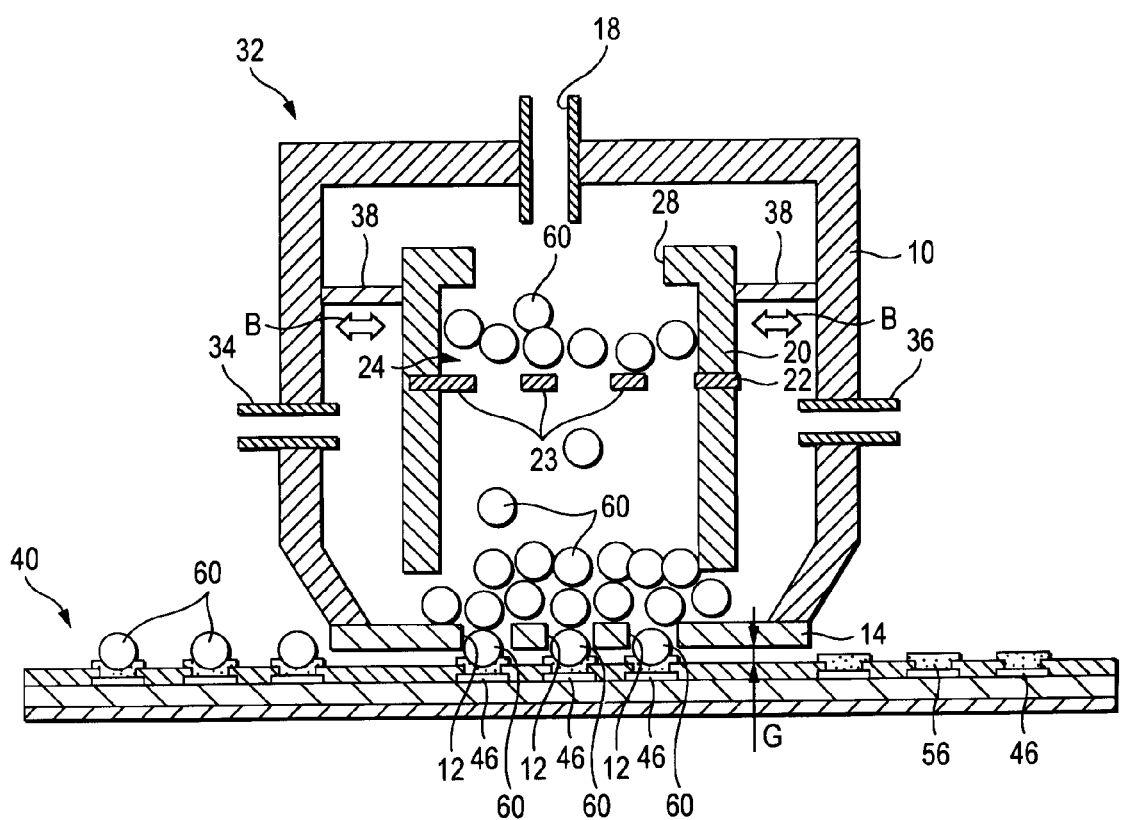
FIG. 9 is a sectional view showing a state that the solder balls are mounted by vibrating an inner cylinder of the head according to Embodiment 2.

Then, as shown in FIG. 9, the solder balls 60 in the temporary storage 24 are dropped onto the mask 14 through meshes 23 of the sieve 22 while the inner cylinder 20 of the head 32 is vibrated horizontally by activating a vibrating mechanism (not shown) as indicated with an arrow B. The solder balls 60 are fed onto the connection pads 46 via the openings 12 of the mask 14 and are mounted thereon. Accordingly, one solder ball 60 is mounted on each of the connection pads 46. The solder balls 60 are adhered/secured onto each of the connection pads 46 by the adhesive flux 56 coated thereon.

Figure 10:
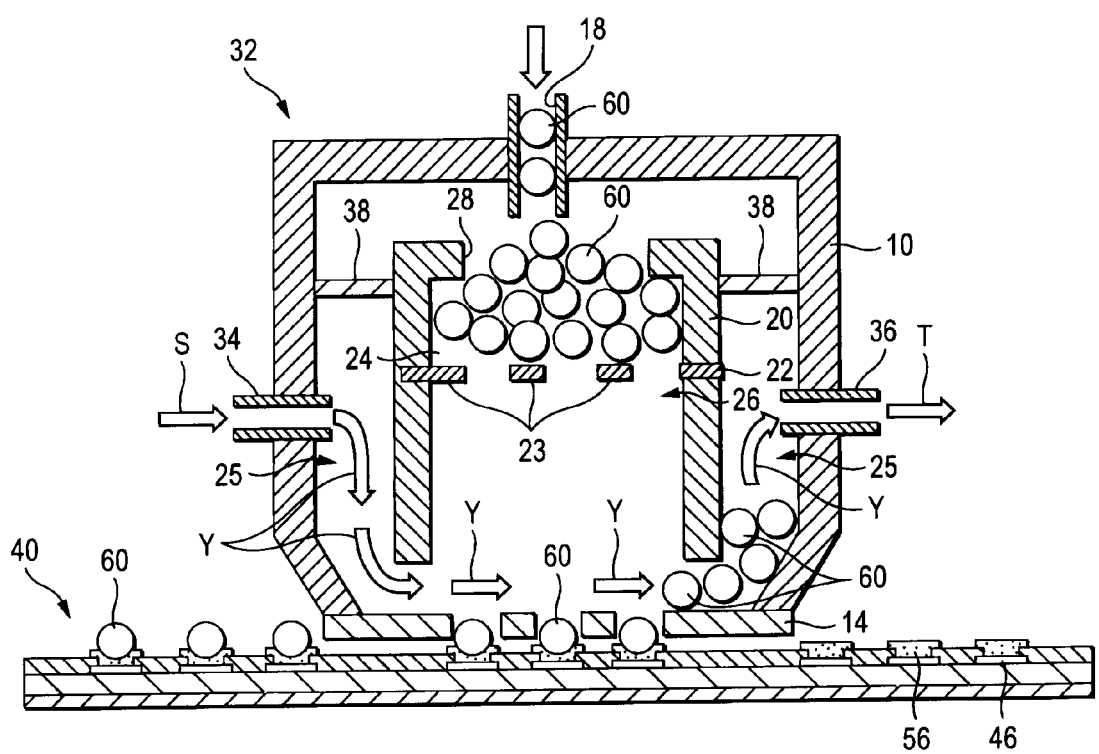
FIG. 10 is a sectional view showing a state that the solder balls remaining on the mask are moved and stored in an outer frame on the exhaust port side after mounting the solder balls, according to Embodiment 2.

Then, as shown in FIG. 10, an airflow Y being directed outward on the mask 14 is generated by exhausting an air from the exhaust port 16 as indicated with an arrow T, while supplying an air from the inlet port 29 to the lower space 26 using an external air supplying apparatus (not shown) as indicated with arrows S and Y. Thus, the solder balls 60 remaining on the mask 14 are held in the clearance 25 before the exhaust port 36.

As another embodiment the solder balls 60 remaining on the mask 14 may be exhausted from the exhaust port 36 to the outside by the airflow Y being directed outward. The solder balls exhausted to the outside are recovered by the recovering apparatus, and then can be used again. In this embodiment, at least in the area from the mask 14 to the exhaust port 36, the clearance 25 between the outer frame 10 and the exhaust port 36 is set to a dimension through which the solder ball 60 can easily pass. Also, the exhaust port 36 is set to a dimension through which the solder ball 60 can easily pass.

When the conductive (made of metal such as nickel) mask is used as the mask 14, the static charges of the solder balls 60 can be dissipated via the mask 14. Therefore, even when the solder balls 60 are as minute as 100 μm or less, for example, the aggregation of the solder balls 60 caused due to the static attractive force never occurs.

The new solder balls 60 are dropped and fed into the temporary storage 24 from the inflow path 18 provided to the top end of the outer frame 10 through the solder ball supply port 28. For convenience of illustration, the recovery of the remaining solder balls 60 and the feed of the new solder balls 60 are depicted together in FIG. 10, but the recovery and the feed are not actually carried out at the same time. Actually, the feed of the solder balls 60 is performed in an appropriate timing after the recovery of the remaining solder balls 60 is completed but before mounting of the solder balls is performed in the next solder ball mounting target area by vibrating the inner cylinder 20.

Figure 11:
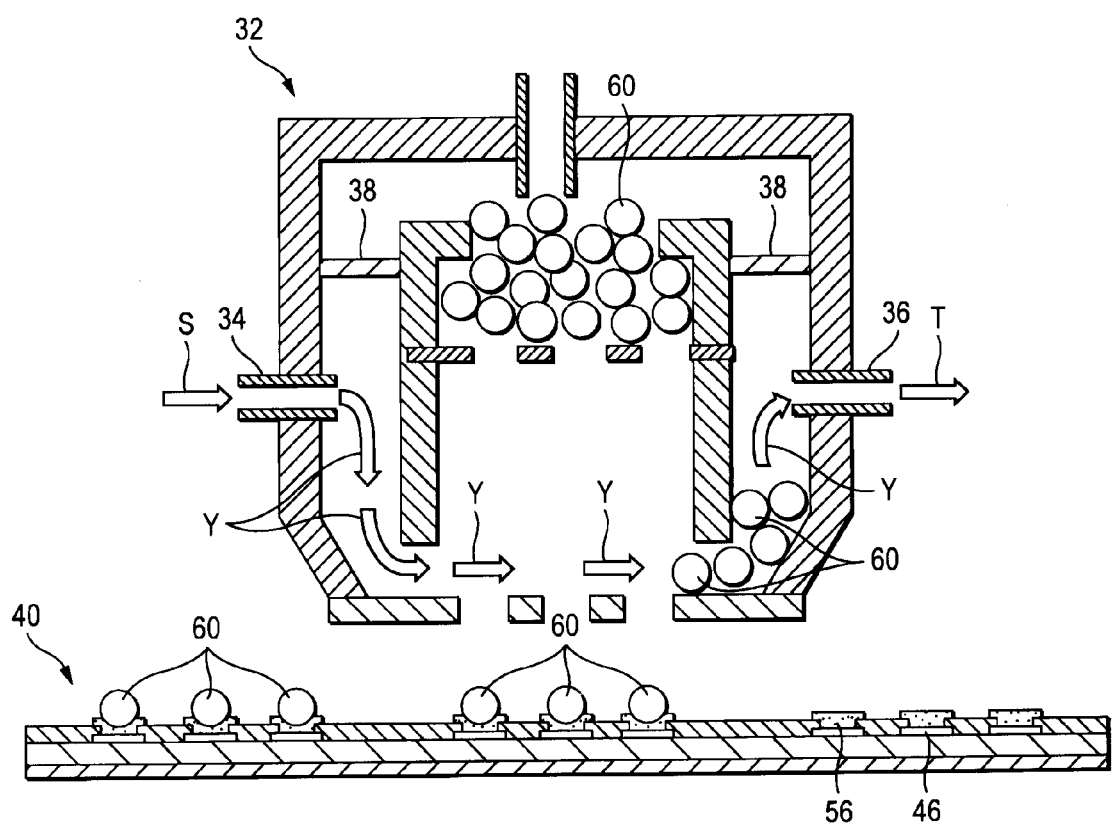
FIG. 11 is a sectional view showing a state that the head is moved up while the remaining solder balls are stored in the outer frame after mounting the solder balls, according to Embodiment 2.

After the mounting and the recovery of the solder balls 60 are completed, the head 30 is moved up as shown in FIG. 11, then the head is moved to the next solder ball mounting target area on the substrate and stopped there. Then, the steps similar to those applied to the area A are carried out. For convenience of illustration, FIG. 11 shows a state that the solder balls 60 have already been fed into the temporary storage 24. In this case, as described above, the feed of the new solder balls 60 may be performed in an adequate timing until the solder balls 60 are mounted in the next solder ball mounting target area.

In Embodiment 2, as shown in FIG. 11, the supply and exhaustion of the air are continued through the inlet port and the exhaust port respectively until the head is positioned in the next ball mounting position. Then, the extra balls are moved to the inner wall (the inner wall on the opposite side to the inlet port side) of the outer frame on the exhaust port side, and continue to be maintained there.

The supply and exhaustion of the air are stopped when the head is positioned in the next ball mounting position. Then, the extra balls are returned again to the mask and are mounted on the connection pads 46.

Also, FIG. 11 shows a state that the solder balls 60 remaining on the mask 14 are maintained in the clearance 25 before the exhaust port 36. As described above, in another embodiment, the solder balls 60 remaining on the mask 14 can be exhausted from the exhaust port 36 to the outside by the airflow Y being directed outward. Thus, the remaining solder balls 60 can be recovered by the recovering apparatus and can be used again.

When the operations described with reference to FIG. 8 to FIG. 11 are repeatedly performed, one solder ball 60 can be mounted on a large number of connection pads 46 without fail effectively over the whole surface of the large substrate 40.

In Embodiment 2, the structure/mechanism of the head can be simplified as compared with that in Embodiment 1.

According to exemplary embodiments of the present invention, a pass/fail test of electrical characteristics can be conducted every solder ball mounting target area of the large-size substrate, and also the mounting can be performed only in the good area by skipping the defective area. Therefore, the useless mounting process can be omitted.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A conductive ball mounting apparatus for mounting one conductive ball on each of a plurality of connection pads formed on a substrate, comprising:
   an outer frame;
   an inner cylinder provided in the outer frame, wherein an upper surface and a lower surface of the inner cylinder are opened;
   a sieve provided in the inner cylinder, wherein the inner cylinder is partitioned into an upper space and a lower space by the sieve;
   an inlet port for supplying an air from an outside to the lower space of the inner cylinder;

a mask provided to a lower end of the outer frame and having openings, the openings being provided to correspond to conductive ball mounting positions; and an exhaust port for exhausting an air from an upper surface of the mask to the outside and being provided to the lower end of the outer frame, wherein the inner cylinder is adapted to vibrate without being restricted by the outer frame.

2. The conductive ball mounting apparatus of claim 1, wherein the mask is made of a conductive material.

* * * * *